(12) United States Patent
Lin

(10) Patent No.: US 7,324,386 B2
(45) Date of Patent: Jan. 29, 2008

(54) RELIABLE METHOD FOR ERASING A FLASH MEMORY

(75) Inventor: Yang-Chieh Lin, Tainan (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 0 days.

(21) Appl. No.: 11/308,668

(22) Filed: Apr. 20, 2006

(65) Prior Publication Data

US 2007/0247922 A1 Oct. 25, 2007

(51) Int. Cl.
*G11C 16/04* (2006.01)
(52) U.S. Cl. ............... 365/185.29; 365/33; 365/185.23
(58) Field of Classification Search ........... 365/185.29, 365/185.33, 185.23
See application file for complete search history.

(56) References Cited

U.S. PATENT DOCUMENTS

| 6,055,190 A | * | 4/2000 | Lu et al. ................. 365/185.22 |
| 2002/0141236 A1 | * | 10/2002 | Nakai et al. ........... 365/185.03 |
| 2007/0086251 A1 | * | 4/2007 | Lutze et al. ................. 365/195 |

* cited by examiner

*Primary Examiner*—Thong Q. Le
(74) *Attorney, Agent, or Firm*—Jianq Chyun IP Office (57) ABSTRACT

A method for erasing a flash memory group is provided, which comprises the following steps. (a) Apply a erase (ERS) pulse to a first subset of the group. (b) Perform one of a soft program verification (SPGMV) and a tight soft program verification (TSPGMV) on the first subset of the group. (c) Repeat steps (a) and (b) until a first predetermined condition is true. (d) Perform an erase verification (ERSV) on a second subset of the group. (e) Repeat steps (a) to (d) until a second predetermined condition is true. And (f) fix bit line leakage in a third subset of the group with a slow program (SLPGM) and apply an ERS pulse to the third subset.

19 Claims, 5 Drawing Sheets

RELIABLE METHOD FOR ERASING A FLASH MEMORY

BACKGROUND OF THE INVENTION

1. Field of the Invention

The present invention relates to methods for erasing flash memory. More particularly, the present invention relates to a method for erasing non-uniform flash memory sectors and a method for erasing flash memory sector groups.

2. Description of the Related Art

Every time a flash memory cell is erased, there is always a possibility that its threshold voltage becomes lower. Over-erase is the situation when there is bit line leakage in a flash memory cell. If such a memory cell is erased again, deep over-erase may happen. Deep over-erase is unrecoverable and should be avoided.

Figure 1:
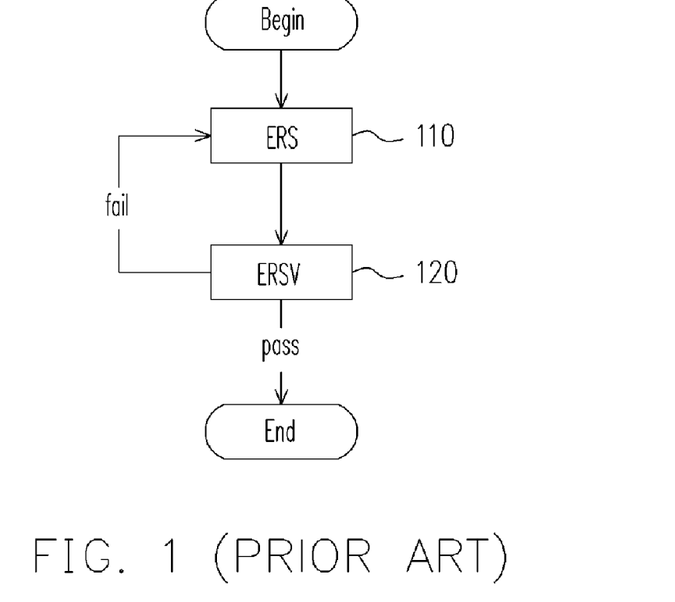
FIG. 1 is a flow chart of a conventional method for erasing a flash memory group.

FIG. 1 is a flow chart of a conventional method for erasing a flash memory sector group. A sector group is a set consisting of multiple memory sectors. An erase (ERS) pulse is applied to a sector group in step 110, erasing all sectors in the group at the same time. And then an erase verification (ERSV) is performed on the group in step 120. If all cells pass the ERSV, the flow in FIG. 1 terminates. Otherwise, the flow returns to step 110, where another erase pulse is applied to the flash memory sector group. The loop of steps 110 and 120 is repeated until all cells pass the ERSV.

Figure 2:
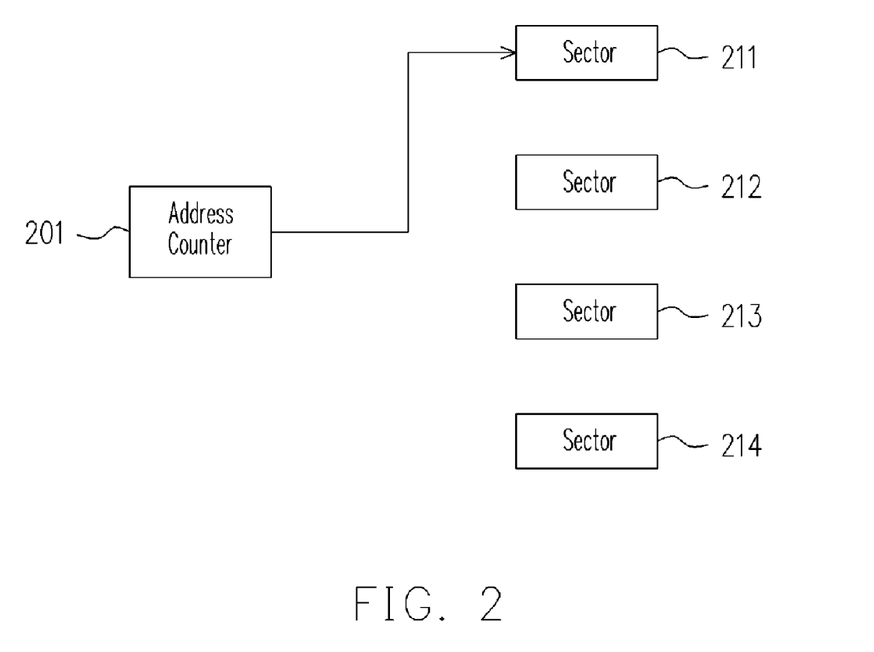
FIG. 2 is a schematic diagram showing an address counter and some memory sectors of a flash memory chip.

The ERSV is performed address by address. Therefore, an address counter is necessary for keeping the current verification address. FIG. 2 is a schematic diagram showing an address counter 201 and some memory sectors 211~214 of a flash memory chip. The sector group in FIG. 2 is erased by the method in FIG. 1. Assume the ERSV begins at the first address of sector 211. The problem is that whenever a memory cell fails in the ERSV, another erase pulse is applied to the entire group and then the ERSV has to start all over again. Consequently, the memory cells at the high end of address may be erased an undesirably large number of times and deep over-erase may occur. In this example, deep over-erase is most likely to occur in sector 214.

Figure 3:
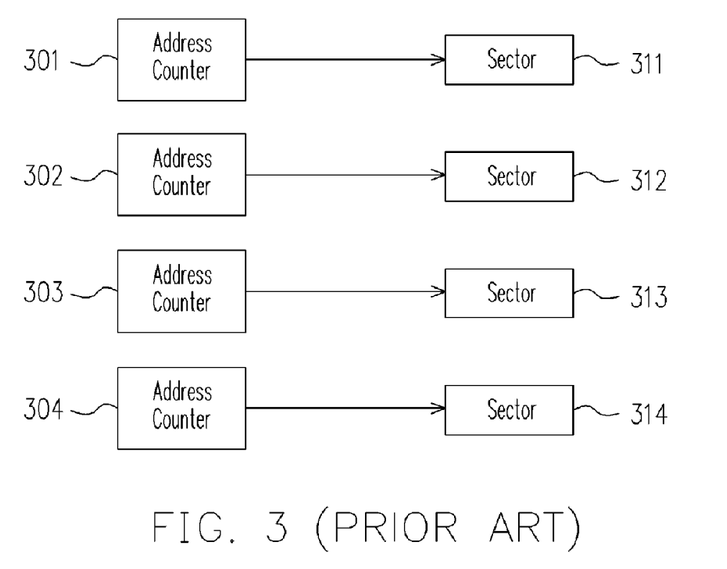
FIG. 3 is a schematic diagram showing some address counters and some memory sectors of a conventional flash memory chip.

A solution for the problem above is assigning an address counter to each memory sector, as shown in FIG. 3. The flash memory chip in FIG. 3 has four sectors 311~314 and four address counters 301~304 corresponding to the sectors 311~314. Each address counter 301~304 stores the verification address of the corresponding sector 311~314. If a sector in FIG. 3 is erased and passes the erase verification, the sector will not be erased again. This solution greatly reduces the risk of deep over-erase. However, due to the extra address counters, the flash memory chip in FIG. 3 occupies much more layout space than the chip in FIG. 2 does.

Figure 4:
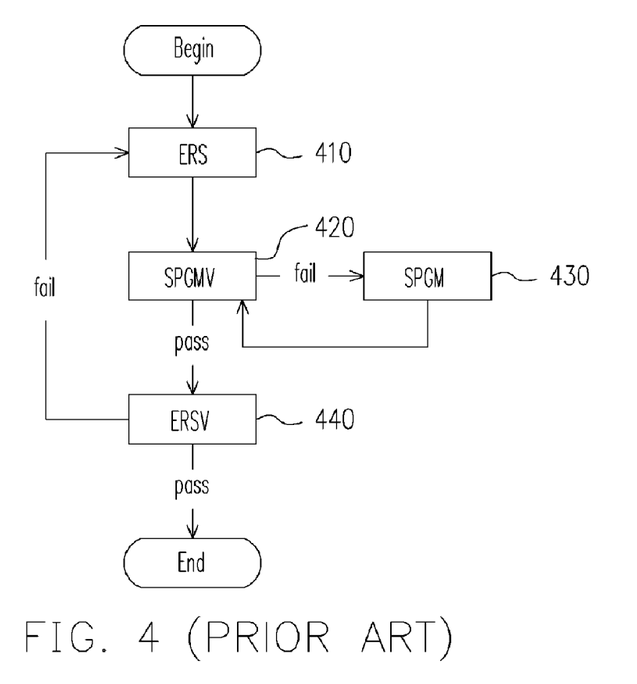
FIG. 4 is a flow chart of another conventional method for erasing a flash memory group.

Another solution to prevent deep over-erase is the method shown in FIG. 4. FIG. 4 is a flow chart of another conventional method for erasing a flash memory group. Firstly, an erase (ERS) pulse is applied to the memory group in step 410. And then a soft program verification (SPGMV) is performed on the group to check for bit line leakage in step 420. If a sector fails in step 420, that means the sector has bit line leakage and a soft program (SPGM) is performed on the sector to fix the leakage in step 430. After the SPGM the sector is verified again in step 420. The loop of steps 420 and 430 is repeated until the sector is completely fixed. Now all sectors have passed the SPGMV in step 420. And then an erase verification (ERSV) is performed on the group in step 440. If the group passes the ERSV, the flow of the method terminates. Otherwise, the flow returns to step 410 where the group is erased again. This method prevents deep over-erase by fixing leaking sectors before another erase pulse is applied. However, it is possible that a sector gets leaky every time and has to be fixed again and again. A lot of time would be wasted in such a situation.

SUMMARY OF THE INVENTION

Accordingly, the present invention is related to a method for erasing one or more flash memory sector(s). The method is capable of erasing non-uniform sectors, sectors which become leaky after being erased and fail in an erase verification, and preventing deep over-erase. This method is faster than conventional methods. The primary cause of the higher efficiency of this method is that there is no need for erase verification every time after an erase operation. The secondary cause is that the conservative erase proposed by the present invention includes the steps of slow program (SLPGM) and slow program verification (SLPGMV) to repair leaky bit lines, and the steps of SLPGM and SLPGMV are executed much less frequently than their counterparts are executed in conventional methods.

The present invention is also related to a method for erasing a flash memory group. This method prevents deep over-erase, is faster than conventional methods, and saves layout area because only one address counter is used. This method is useful for both group erase and sector erase. This method also saves the time of soft program after erase because only a part of the sectors need to be considered at the soft program stage. In addition, this method classifies flash memory sectors into many types for different procedures.

According to an embodiment of the present invention, a method for erasing one or more non-uniform flash memory sector(s) is provided. The method is characterized by fixing bit line leakage in the sector(s) with slow program (SLPGM) and applying an erase (ERS) pulse to the sector(s). More specifically, the method comprises the following steps. (a) Perform a soft program verification (SPGMV) on the sector(s). (b) If a sector fails in the SPGMV, fix the sector with the SLPGM. (c) Perform an erase verification (ERSV) on the sector(s). And (d) if a sector fails in the ERSV, apply the ERS pulse to the sector and return to step (a).

In an embodiment of the present invention, the step (b) above further comprises the following sub-steps. (b1) Perform the SLPGM on the sector. (b2) Perform a slow program verification (SLPGMV) on the sector. And (b3) return to step (b1) if the sector fails in the SLPGMV.

According to another embodiment of the present invention, a method for erasing a flash memory group is provided. The method comprises the following steps. (a) Apply an erase (ERS) pulse to a first subset of the group. (b) Perform one of a soft program verification (SPGMV) and a tight soft program verification (TSPGMV) on the first subset of the group. (c) Repeat steps (a) and (b) until a first predetermined condition is true. (d) Perform an erase verification (ERSV) on a second subset of the group. (e) Repeat steps (a) to (d) until a second predetermined condition is true. And (f) fix bit line leakage in a third subset of the group with a slow program (SLPGM) and apply an ERS pulse to the third subset. In fact, step (f) is the previous method for erasing one or more non-uniform flash memory sector(s).

In an embodiment of the present invention, flags A, B and C are used to identify the states of the sectors. Sectors which failed in the SPGMV are marked with the flag A. Sectors which passed the ERSV are marked with the flag B. Sectors which are already marked with flag A and failed in the ERSV are marked with the flag C. In this embodiment, the first subset is all sector(s) in the group without a flag A or a flag B. The second subset is all sector(s) in the group without the flag B or a flag C. The third subset is all sector(s) in the group marked with the flag C.

The above method for erasing a flash memory group has two major variations. In the first variation, the SPGMV is performed in step (b). Furthermore, step (b) further comprises marking a sector with the flag A if the sector fails in the SPGMV. And the first predetermined condition is that the ERS pulse has been applied a predetermined number of times or each sector in the group is marked with the flag A or the flag B.

In the second variation of the method, the TSPGMV is performed in step (b) with a predetermined initial word line voltage. Furthermore, step (b) further comprises marking a sector with the flag A if the sector fails in the TSPGMV when the word line voltage used in the TSPGMV is about 0V, and step(d) further comprises decreasing the word line voltage used in the TSPGMV of a sector by a predetermined amount if the sector fails in the ERSV.

Moreover, in an embodiment of the present invention, the first predetermined condition is that a sector fails in the TSPGMV.

Alternatively, in another embodiment of the present invention, the first predetermined condition is that a sector fails in the TSPGMV or the ERS pulse has been applied a predetermined number of times.

Common to the variations above, in an embodiment of the present invention, step (d) further comprises the following sub-steps. If a sector passes the ERSV, mark the sector with the flag B. And if a sector marked with the flag A fails in the ERSV, mark the sector with the flag C.

Also common to the variations above, in an embodiment of the present invention, the second predetermined condition is that each sector in the group is marked with the flag B or the flag C.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

As is discussed below, the preferred embodiments of the present invention use flags to mark sectors with bit line leakage and sectors which pass the erase verification. Therefore the embodiments below can prevent deep over-erase and improve efficiency by withholding redundant, and sometimes harmful, erase pulses. Another factor contributing to efficiency is that the embodiments below use soft program verification, which is much faster than erase verification, to reduce the usage of time-consuming erase verification.

Figure 5:
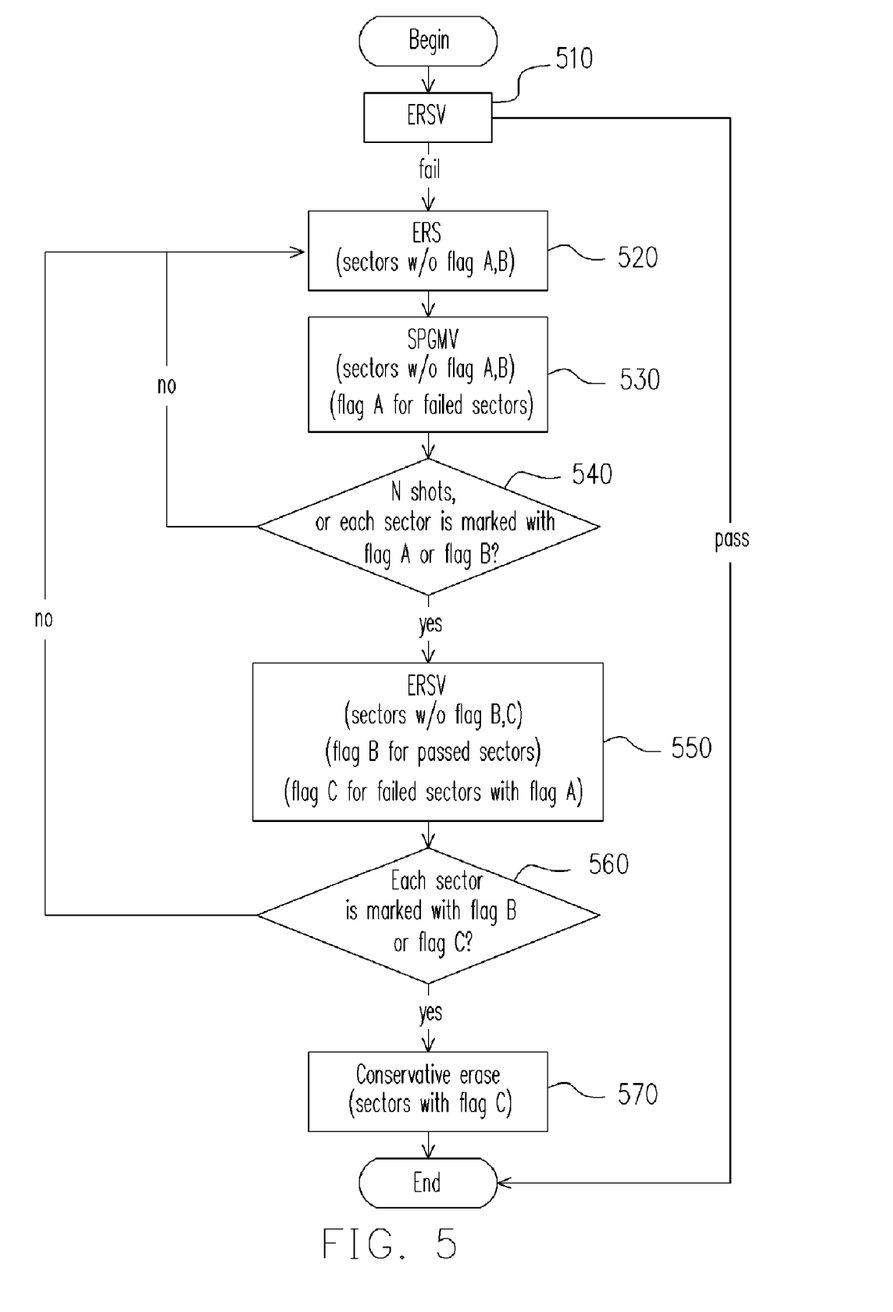
FIG. 5 is a flow chart of a method for erasing a flash memory group according to an embodiment of the present invention.

FIG. 5 is a flow chart of a method for erasing a flash memory group according to an embodiment of the present invention. The flow begins at step 510. First, an erase verification (ERSV) is performed on the group. If the entire group pass the ERSV, the flow terminates. Otherwise, the flow proceeds to step 520, where an erase (ERS) pulse is applied to all sectors without flag A or B in the group. Here flag A is associated with leaky sectors. Flag B is associated with sectors which have already been erased and passed an erase verification. Moreover, there is a flag C associated with "non-uniform" sectors. Non-uniform sectors are leaky sectors which still cannot pass an ERSV. Sectors marked with flag A or B are skipped in step 520 because leaky sectors should not be erased again and sectors which pass an ERSV need not be erased again. Sectors with flag C are also skipped in step 520 because sectors with flag C are always marked with flag A previously, as shown in the following steps.

And then in step 530, a soft program verification (SPGMV) is performed on all sectors without flag A or B in the group. If a sector fails in the SPGMV in step 530, the sector is marked with flag A. The SPGMV is used to look for leaky sectors after an erase pulse is applied. Since sectors with flag A or B are skipped in step 520, they are also skipped in step 530.

After step 530, step 540 enforces a conditional loop consisting of steps 520 and 530. The loop is repeated until the ERS pulse in step 520 has been applied a predetermined number of times (N shots) or each sector in the group is marked with flag A or B.

After the loop, an erase verification (ERSV) is performed on sectors without flag B or C in the group in step 550. If a sector passes the ERSV in step 550, the sector is marked with flag B. Furthermore, if a sector already marked with flag A fails in the ERSV in step 550, the sector is marked with flag C. Sectors with flag B are skipped in step 550 because they have already passed a previous ERSV. Sectors with flag C are skipped here because they will not be erased again after being marked with flag C.

After step 550, step 560 enforces a second conditional loop consisting of steps 520 to 550. Steps 520 to 550 are repeated until each sector in the group is marked with flag B or C. As can be seen in steps 520 to 560, a leaky sector is identified and marked with flag A in step 530, and then the leaky sector won't be erased again in steps 520 to 560. In this way, this embodiment prevents deep over-erase. Moreover, An SPGMV is performed bit line by bit line, while an ERSV is performed cell by cell. Hence an SPGMV is much faster than an ERSV. The ERSV in step 550 is performed after a predetermined number of erase pulses, instead of after every erase pulse as in conventional methods. By using SPGMV in step 530 and reducing the frequency of ERSV in step 550, this embodiment is much faster than conventional methods. And so this embodiment can use only one address counter.

After step 560, in step 570 a "conservative erase" (details later) is performed on sectors marked with flag C (that is, non-uniform sectors) in the group. If there is no sectors with flag C, step 570 is simply skipped and the flow of this embodiment stops here. Conservative erase is a method for safely erasing non-uniform sectors, which is characterized by fixing bit line leakage in non-uniform sectors with slow program (SLPGM) and then applying erase pulses to the non-uniform sectors. Detailed flow of the conservative erase is shown in FIG. 6.

Figure 6:
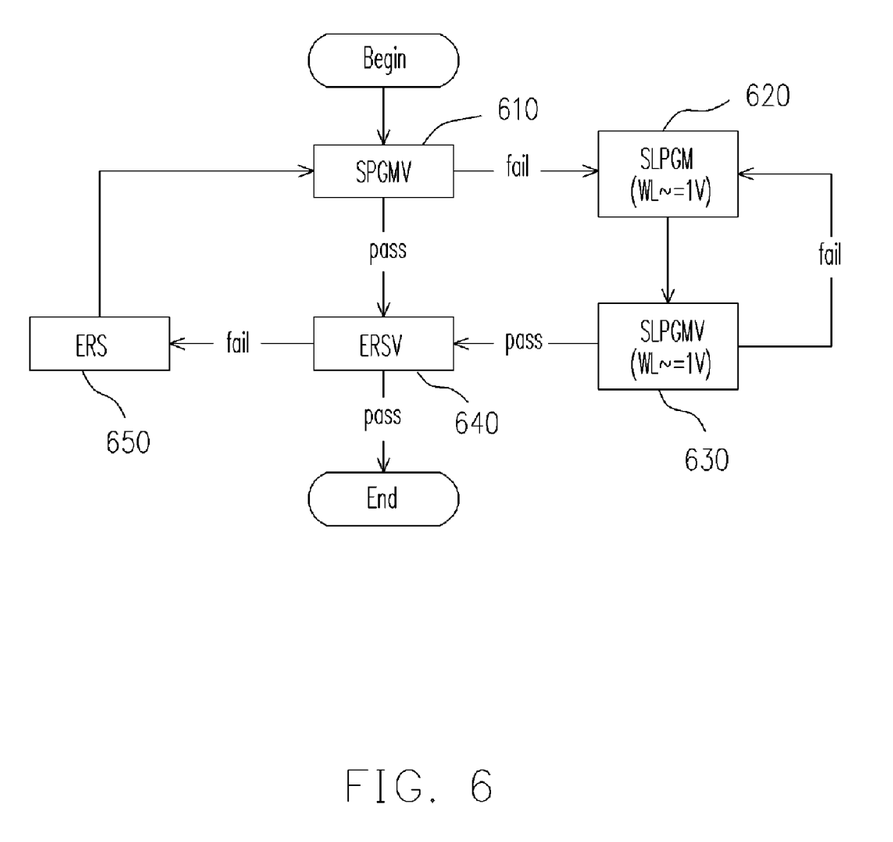
FIG. 6 is a flow chart of a conservative erase routine according to an embodiment of the present invention.

FIG. 6 is a flow chart of the conservative erase according to an embodiment of the present invention. The flow begins at step 610. First, a soft program verification (SPGMV) is performed on the non-uniform sectors in step 610. For sectors which passed the SPGMV, the flow proceeds to step 640. For sectors which failed in the SPGMV, the flow proceeds to step 620, where a slow program (SLPGM) is performed on the non-uniform sectors. A slow program increases the threshold voltage of a flash memory cell more than a soft program does. Therefore a memory cell through a slow program won't leak so easily after an erase pulse. In other words, it is less likely to have to fix the same sector again and again after each erase pulse as in conventional methods. In this way, the conservative erase is faster than conventional methods.

After the SLPGM, a slow program verification (SLPGMV) is performed on the non-uniform sectors in step 630. If a sector fails in the SLPGMV, the flow returns to step 620, and this loop continues until the sector passes the verification in step 630. And then the flow goes to step 640. In this embodiment, the SLPGM in step 620 and the SLPGMV in step 630 are performed with a word line (WL) voltage of about 1V.

In step 640, an erase verification (ERSV) is performed on the non-uniform sectors. For sectors which passed the ERSV, the flow stops here. For sectors which failed in the ERSV, the flow goes to step 650. An erase (ERS) pulse is applied to these sectors in step 650. And then the flow proceeds to step 610, where another SPGMV is performed on these sectors to check for bit line leakage. The entire loop of the conservative erase continues until all sectors pass the erase verification in step 640.

In this embodiment the WL voltage for the SLPGM is recommended to be 1V, since physically, when a flash memory cell is being programmed sufficiently long, its threshold voltage will "converge" to around the applied WL voltage. As a result, after SLPGM operation, the threshold voltages of all flash cells on that particular WL will converge to around 1V, which is an ideal voltage because 1V is between the required threshold voltage for passing an ERSV (3V) and the threshold voltage of an over erase condition (0V). That is also why conservative erase does not always need an SLPGM operation to repair over erased cells after every erase pulse, thus saving the operation time. Therefore, an SLPGM is better than an SPGM with a WL voltage of 0V.

Figure 7:
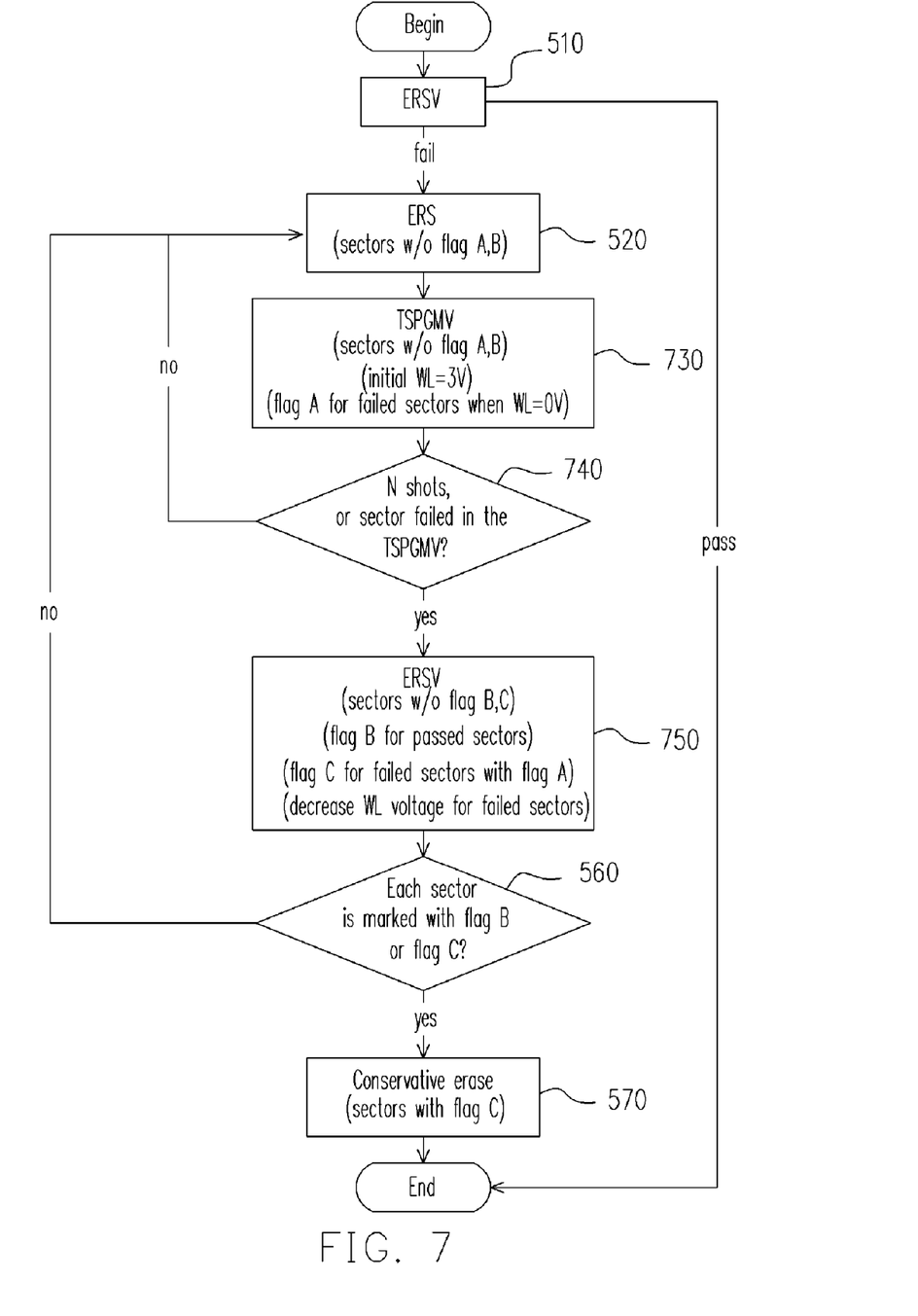
FIG. 7 is a flow chart of another method for erasing a flash memory group according to an embodiment of the present invention.

FIG. 7 is another method for erasing a flash memory group according to another embodiment of the present invention. The difference between the method in FIG. 7 and the method in FIG. 5 is that steps 530 to 550 in FIG. 5 are replaced with steps 730 to 750 in FIG. 7. For brevity, only the difference is discussed below.

After the erase (ERS) pulse in step 520, a tight soft program verification (TSPGMV) is performed on sectors without flag A or B in the group. The first TSPGMV is performed with an initial word line (WL) voltage of about 3V. If a sector fails in the TSPGMV when the word line voltage used in the TSPGMV is about 0V, the sector is marked with flag A. A TSPGMV with a word line voltage of 0V is equivalent to a soft program verification (SPGMV).

After the TSPGMV, step 740 enforces a conditional loop consisting of steps 520 and 730. Steps 520 and 730 are repeated until a sector fails in the TSPGMV or the ERS pulse in step 520 has been applied a predetermined number of times (N shots). Step 730 uses TSPGMV instead of SPGMV for higher efficiency. As can be seen, the loop of steps 520 to 740 is faster than its counterpart in FIG. 5 because TSPGMV uses a higher word line voltage and is stricter than SPGMV. Therefore a sector fails sooner in a TSPGMV than in a SPGMV. The N shots limit is included in the conditional loop because the threshold voltage of a memory cell may drop very slightly after an erase pulse is applied. The N shots limit precludes the condition that the loop runs too many times or even becomes an endless loop. If there is no such concern, the N shots limit can be removed. In that case, steps 520 and 730 would be repeated until a sector fails in the TSPGMV in step 730.

After the loop, in step 750 an erase verification (ERSV) is performed on sectors without flag B or C in the group. The major difference between step 750 in FIG. 7 and step 550 in FIG. 5 is that if a sector fails in the ERSV in step 750, next time when the TSPGMV is performed in step 730, the word line voltage for this sector will be decreased by about 0.5V. Since an ERSV failure means a memory cell is not erased enough, the next TSPGMV will use a lower word line voltage so that the memory cell can be erased deeper. Please note that, in step 730, the initial word line voltage of 3V and the decrement of 0.5V are both variable in the scope of the present invention.

The initial word line voltage for the TSPGMV above is recommended to be 3V, but not limited to 3V. The initial WL voltage is determined by the pass condition of the ERSV. For example, in this embodiment the pass condition of the ERSV is that the threshold voltages of all flash cells in an array are below 3V. For a TSPGMV with a WL voltage of 3V, the fail condition of the TSPGMV is that the threshold voltage of any cell in an array is below 3V. That is, the threshold voltages of some or all cells are below 3V. So there is possibility of passing the ERSV even though when the TSPGMV fails. Thus the ERSV can be performed just after the TSPGMV to determine if erasure is enough. If the ERSV passes, no more erase pulse is needed and time is saved. If the ERSV fails, some cells still have threshold voltages above 3V and more erase pulses are needed. In the next iteration of the loop, the WL voltage of the TSPGMV is changed to about 2.5V. If the TSPGMV fails, the threshold voltages of some cells are below 2.5V and it is possible that the threshold voltages of all cells are below 3V. Consequently the ERSV is performed again. When the WL voltage of the TSPGMV is decreased to 0V, the failure of the TSPGMV means over erase. A TSPGMV with a WL voltage of 0V is equivalent to an SPGMV and the WL voltage should not be further decreased. Those over-erased sectors may need conservative erase to be erased safely.

The verification operations discussed above, such as SPGMV and TSPGMV, are well known to people skilled in the art. For clarity, in the field of flash memory, all kinds of verification are forcing certain voltages to the word lines of both a normal cell and a reference cell, while the bit line voltages of both cells are typically 1V, to compare the currents of the cells. For example, in an ERSV a voltage of 5V is applied to the word lines of both the normal cell and the reference cell. Under this condition, the normal cell current should be larger than the reference cell current for the normal cell to pass the ERSV. As for SPGMV and TSPGMV, the bit line current of normal cells is compared with the reference cell current. Because bit line current is the summation of the current of all cells on the bit line, all word lines, not only one word line, of the cell array have to be forced to the required voltage level.

In summary, the methods for erasing a flash memory group in the embodiments above can prevent deep over-erase and are faster than conventional methods. The methods use flags to keep track of the status of the sectors and eliminate the need for more than one address counters. Therefore the methods save layout area. The methods are useful for both groups erase and sector erase. Finally, the methods also save the time of soft program stage after erase stage because only sectors with both flag A and flag B are considered at the soft program stage.

Furthermore, the conservative erase method for non-uniform sectors in the embodiments above is capable of erasing non-uniform sectors and preventing deep over-erase. The conservative erase of the present invention is faster than conventional methods and doesn't have to fix the same leaky sector every time after an erase pulse.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for erasing one or more flash memory sector(s), characterized by:
    (a) performing a soft program verification (SPGMV) on the sector(s);
    (b) if a sector fails in the SPGMV, fixing bit line leakage in the sector with a slow program (SLPGM), wherein a word line voltage for performing the SPGMV is less than that for performing the SLPGM;
    (c) performing an erase verification (ERSV) on the sections; and
    (d) if a sector fails in the ERSV, applying an erase (ERS) pulse to the sector for erasing the sector and returning to step (a).

2. The method of claim 1, wherein step (b) further comprises:
    (b1) performing the SLPGM on the sector;
    (b2) performing a slow program verification (SLPGMV) on the sector; and
    (b3) returning to step (b1) if the sector fails in the SLPGMV.

3. The method of claim 2, wherein the SLPGM and SLPGMV are preformed with a word line voltage of about 1V.

4. A method for erasing a flash memory group, comprising:
    (a) applying an erase (ERS) pulse to a first subset of the group;
    (b) performing one of a soft program verification (SPGMV) and a tight soft program verification (TSPGMV) on the first subset of the group;
    (c) repeating steps (a) and (b) until a first predetermined condition is true;
    (d) performing an erase verification (ERSV) on a second subset of the group;
    (e) repeating steps (a) to (d) until a second predetermined condition is true; and
    (f) fixing bit line leakage in a third subset of the group with a slow program (SLPGM) and applying an ERS pulse to the third subset.

5. The method of claim 4, wherein the first subset is all sector(s) in the group without a flag A or a flag B, the second subset is all sector(s) in the group without the flag B or a flag C, the third subset is all sector(s) in the group marked with the flag C, the flag A is used for marking a sector which failed in the SPGMV, the flat B is used for marking a sector which passed the ERSV, the flag C is used for marking a sector which is already marked with the flag A and failed in the ERSV.

6. The method of claim 5, wherein the SPGMV is performed in step (b).

7. The method of claim 6, wherein step (b) further comprises:
    if a sector fails in the SPGMV, marking the sector with the flag A.

8. The method of claim 7, wherein the first predetermined condition is that the ERS pulse has been applied a predetermined number of times or each sector in the group is marked with the flag A or the flag B.

9. The method of claim 5, wherein the TSPGMV is performed in step (b) with a predetermined initial word line voltage.

10. The method of claim 9, wherein the predetermined initial word line voltage is about 3V.

11. The method of claim 9, wherein step (b) further comprises:
    if a sector fails in the TSPGMV when the word line voltage used in the TSPGMV is about 0V, marking the sector with the flag A;
    and step(d) further comprises:
    if a sector fails in the ERSV, decreasing the word line voltage used in the TSPGMV of the sector by a predetermined amount.

12. The method of claim 11, wherein the predetermined amount is about 0.5V.

13. The method of claim 11, wherein the first predetermined condition is that a sector fails in the TSPGMV.

14. The method of claim 11, wherein the first predetermined condition is that a sector fails in the TSPGMV or the ERS pulse has been applied a predetermined number of times.

15. The method of claim 5, wherein step (d) further comprises:
    if a sector passes the ERSV, marking the sector with the flag B; and
    if a sector marked with the flag A fails in the ERSV, marking the sector with the flag C.

16. The method of claim 5, wherein the second predetermined condition is that each sector in the group is marked with the flag B or the flag C.

17. The method of claim 4, wherein step (f) further comprises:
    (f1) performing an SPGMV on the third subset;
    (f2) if a sector fails in the SPGMV, fixing the sector with the SLPGM;
    (f3) performing an ERSV on the third subset; and
    (f4) if a sector fails in the ERSV, applying the ERS pulse to the sector and returning to step (f1).

18. The method of claim 17, wherein step (f2) further comprises:

(f21) performing the SLPGM on the sector;

(f22) performing a slow program verification (SLPGMV) on the sector; and (f23) returning to step (f21) if the sector fails in the SLPGMV.

19. The method of claim 18, wherein the SLPGM and the SLPGMV are performed with a word line voltage of about 1V.

* * * * *